(12) United States Patent
Loo et al.

(10) Patent No.: US 6,342,332 B1
(45) Date of Patent: Jan. 29, 2002

(54) LIQUID PHOTOIMAGABLE RESIST WHICH IS RESISTANT TO BLOCKING

(75) Inventors: Dekai Loo; Richard T. Mayes, both of New Castle County, DE (US)

(73) Assignee: MacDermid, Incorporated, Waterbury, CT (US)

( * ) Notice: Subject to any disclaimer, the term of this patent is extended or adjusted under 35 U.S.C. 154(b) by 1278 days.

(21) Appl. No.: 08/562,316

(22) Filed: Feb. 5, 1996

Related U.S. Application Data

(63) Continuation of application No. 08/316,171, filed on Sep. 30, 1994.

(51) Int. Cl.$^7$ ................................................. G03C 1/76
(52) U.S. Cl. ................................ 430/270.1; 430/288.1; 430/325; 430/330
(58) Field of Search .......................... 430/270.1, 288.1, 430/325, 330

(56) References Cited

U.S. PATENT DOCUMENTS

| 4,293,635 A | | 10/1981 | Flint et al. ................... 430/271 |
|---|---|---|---|
| 4,339,527 A | * | 7/1982 | Hill .............................. 430/322 |
| 4,539,286 A | | 9/1985 | Lipson et al. ................ 430/277 |
| 4,692,396 A | | 9/1987 | Uchida ........................ 430/284 |
| 4,925,768 A | | 5/1990 | Iwasaki et al. .............. 430/271 |
| 4,935,330 A | * | 6/1990 | Hofmann et al. ........... 430/281 |
| 5,071,730 A | * | 12/1991 | Allen et al. .................. 430/270 |
| 5,114,831 A | | 5/1992 | Seitz et al. .................. 430/281 |
| 5,120,633 A | | 6/1992 | Bauer et al. ................. 430/176 |
| 5,234,791 A | * | 8/1993 | Dammel et al. ............ 430/270 |
| 5,262,281 A | | 11/1993 | Bauer et al. ................. 430/323 |
| 5,312,715 A | * | 5/1994 | Daniels et al. .............. 430/280 |
| 5,369,184 A | * | 11/1994 | Burgoyne, Jr. et al. .. 525/327.6 |
| 5,502,111 A | * | 3/1996 | Huynh-Ba .................. 525/239 |

FOREIGN PATENT DOCUMENTS

| AU | 8938228 | 1/1990 |
|---|---|---|
| JP | 4285960 | 10/1992 |

* cited by examiner

*Primary Examiner*—Laura Weiner
(74) *Attorney, Agent, or Firm*—Carmody & Torrance LLP

(57) ABSTRACT

A liquid applied photoresist composition is disclosed which exhibits a favorable balance of photospeed and overall physical properties. The photoresist composition includes a binder, a multifunctional monomer, a photoinitiator, and a solvent. The photoinitiator is present in the photoresist in an amount of greater than about 10% by weight of the photoresist without solvent. The photoresist when applied is relatively resistant to blocking when applied to a substrate.

A process for producing a negative resist image on a surface using the photoresist is also disclosed.

16 Claims, No Drawings

LIQUID PHOTOIMAGABLE RESIST WHICH IS RESISTANT TO BLOCKING

This application is a continuation of application Ser. No. 08/316,171, filed on Sep. 30, 1994.

FIELD OF THE INVENTION

This invention relates to liquid photoimageable resists compositions. More particularly, this invention relates to liquid photoimageable resists compositions having utility in print and acid etching applications used to produce printed circuit boards in the electronics industry.

BACKGROUND OF THE INVENTION

Liquid photopolymerizable compositions can be used in the manufacture of printed circuit boards as photoresists. In typical use, a liquid photopolymerizable composition is applied to a copper-clad substrate through any means commonly used in the art, including roll coating, curtain coating, screen coating or spin coating. The material subsequentially dried and the dried material exposed in certain areas to actinic radiation that preferentially cures the material. The cured material is then washed with a developing solution to remove unexposed material from the copper surface. The exposed copper surface can then be removed in etching solutions leaving the protected area under the cured photopolymerizable composition to form the electrical circuit. Typically photopolymerizable compositions intended as photoresists are preferably designed to keep exposure time and development time to a minimum.

Liquid resist technology is not new. However, recently there has been increased demand for methods to reduce the cost of manufacturing printed circuits through lower materials cost and higher yields. In the past, liquid resist technology was displaced by dry film photoresist due dry-film photoresist's relatively high yields, ease of processing and increased productivity. However, recent developments in dual-sided roller coating and clean room technology has potentially eliminated problems previously experienced with the use of liquid resists.

Liquid-applied resists (in contrast to dry-film application) suffer from many processing problems. These problems include low photosensitivity due to exposure to atmospheric oxygen, poor blocking characteristics, and slow processing when compared to dry film resists. If in overcoming the reduction in photosensitivity due to exposure to atmospheric oxygen, large quantities of inefficient photoinitiators, such as benzophenone, are used other deficiencies in the resists may arise. At high levels, benzophenone acts as a plasticizer to the resist which thereby may effect the physical properties of the applied resist. One affect of increased levels of benzophenone in a resist is an increase in the material's tendency to block. Typically when a resist is used in a commercial setting, substrates are coated with resist and dried. It may be necessary for these substrates to be stacked and stored for a period of time prior to their exposure to actinic radiation. If these substrates are stacked in such a manner so that areas of a panel coated with resist are in contact with coated areas of an adjacent panel and if these materials exhibit a tendency to block, adjacent panels may stick together and transfer material from one panel to another thereby causing circuit defects and yield losses in the final product. To gain antiblocking properties, the previous resists disclose the use of blooming agents and other additives which migrate to the surface of the dried resist detackifying the material.

Also since benzophenone is a relatively volatile material, resists containing relatively large amounts of benzophenone may, upon drying, exhibit a great degree of variability in their photospeed performance. This variability makes it difficult for one to predict the amount of exposure required to cure the resist.

One object of this invention is to provide a liquid-applied resist which exhibits a good balance of photosensitivity and overall physical properties. Another object of this invention is provision of a liquid-applied resist which exhibits a reduced tendency for blocking compared to other liquid-applied resist formulations.

BRIEF DESCRIPTION OF THE INVENTION

The instant invention relates to a resist material comprising:
a) binder,
b) a multifunctional monomer,
c) a photoinitiator, and
d) a solvent;
wherein the photoinitiator is present in an amount of greater than about 10% by weight of the material without the solvent. Preferably, the solvent comprises propylene glycol methyl ether acetate.

The binder of the resist material comprises an acrylic polymer. Preferably, the binder is present in an amount of greater than about 60% by weight of the material without the solvent.

Preferably in the resist material, the photoinitiator is present in an amount from greater than 10% to about 17% by weight, more preferably in an amount from greater than 10% to about 11% by weight, more preferably about 11% by weight.

The binder of the resist material without the solvent has a $T_g$ of about 110° C. or greater, preferably a $T_g$ of about 110° C. to about 120° C.

The resist material comprising:
a) a binder,
b) a multifunctional monomer,
c) a photoinitiator, and
d) a solvent; where the photoinitiator is present in an amount of greater than about 10% by weight of the material without the solvent,
wherein the material further comprises a flow modifier, a thermal inhibitor and a dye.

The instant invention also relates to a process for producing a negative resist image on a surface. The process comprising coating a resist material onto a conductor clad laminate surface wherein the resist material comprises; binder, a multifunctional monomer, a photoinitiator, and a solvent; wherein the photoinitiator is present in an amount of greater than about 10% by weight of the material without the solvent. The resist material is heated to remove substantially all of the solvent from the resist material to form a dry adherent film. The dry adherent film is exposed imagewise to actinic radiation to form an image, and the latent image is developed to form a negative resist image.

In the process, the resist material may be applied via a roller coater, a screen coater, a curtain coater or a spin coater. Also in the process, resist material is heated above about 93° C. (about 200° F.), preferably about 93° C. to about 107° C. (about 200° F. to about 225° F.) to remove substantially all of the solvent from the resist material to form a dry adherent film.

DETAILED DESCRIPTION OF THE INVENTION

This invention relates to liquid photoimagable resists and provides a material with a sufficient photospeed to be of commercial utility and to be relatively resistant to blocking.

The liquid photoimageable resist of the instant invention comprises a binder, a multifunctional monomer, a photoinitiator and a solvent. Optionally, the liquid photoimageable resist additionally comprises leveling agents, a thermal inhibitors, dyes and the like.

The binder useful in accordance with this invention is prepared from one or more film-forming, vinyl type monomers and one or more alpha, beta ethylenically unsaturated carboxyl group containing monomers having 3–15 carbon atoms, which makes the binder soluble in aqueous media. Examples of useful vinyl type monomers are alkyl and hydroxyalkyl acrylates and methacrylates having 3–15 carbon atoms, styrene, and alkyl substituted styrenes. Examples of useful carboxyl group-containing monomers are cinnamic acid, crotonic acid, sorbic acid, acrylic acid, methacrylic acid, itaconic acid, propionic acid, maleic acid, fumaric acid, and half esters and anhydrides of these acids. The binder has an acid number of about 80 or greater, preferably about 80 to about 160, more preferably about 120 to about 150. A preferred binder comprises an acrylic polymer, more preferably methacrylic acid, methyl methacrylate and ethyl acrylate at a weight ratio of 22.2/64.6/13.2., weight average molecular weight 45,000, acid number 130–150. Other useful binders will be apparent to those skilled in the art.

The binder of the instant invention has a $T_g$ of about 110° C. or greater, preferably a $T_g$ of about 110° C. to about 120° C. It is also preferable that the binder is present in the resist at a dry concentration of about 50% or greater, preferably about 50 to about 70%, more preferably about 55 to about 65% by weight.

The multifunctional monomer that finds application in the subject invention is nongaseous, contains at least 2, preferably 2 to 4, more preferably 2 to 3 ethylenic double bonds. Having at least 2 ethylenic double bonds makes the monomer polyfunctional, i.e., capable of cross-linked polymerization. Suitable monomers include alkylene or polyalkylene glycol diacrylates. Monomers containing vinylidene groups conjugated with ester linkages are particularly suitable. Illustrative examples include but are not limited to ethylene diacrylate; diethylene glycol diacrylate; glycerol diacrylate; glycerol triacrylate; 1,3-propanediol dimethacrylate; 1,2,4-butanetriol trimethacrylate; 1,4-benzenediol dimethacrylate; 1,4-cyclohexanediol diacrylate; pentaerythritol tri- and tetramethacrylate; pentaerythritol tri- and tetraacrylate; tetraethylene glycol dimethacrylate; trimethylolpropane trimethacrylate; triethylene glycol diacrylate; tetraethylene glycol diacrylate; pentaerythritol triacrylate; trimethylol propane triacrylate; pentaerythritol tetraacrylate; 1,3-propanediol diacrylate; 1,5-pentanediol dimethacrylate; and the bis-acrylates and bis-methacrylates of polyethylene glycols, polypropylene glycols, and copolymers thereof of molecular weight from about 100 to about 500 (number average). A preferred multifunctional monomer is ethoxylated bisphenol A dimethacrylate, (SR480 available from Sartomer Co, Exton, Pa.). Other useful polymerizable monomers will be apparent to those skilled in the art.

Photoinitiators useful in accordance with this invention comprises those photoinitiators which are relatively efficient when compared to the efficiency of benzophenone as a photoinitiator in liquid resist systems. Also, photoinitiators useful in accordance with this invention exhibit relatively slow evaporation rates when compared to the evaporation rate of benzophenone in liquid resist systems. The term "photoinitiator" is inclusive of those compounds which function as photoinitiators as well as well as those compounds which function as photosensitizers. The photoinitiator may be any combination of materials selected from the group consisting of aromatic ketones, e.g., 4,4'-bis (dimethylamino)benzophenone, 4,4'-bis(diethylamino) benzophenone, 4 methoxy-4'-dimethylaminobenzophenone, 4,4'-dimethoxybenzophenone, 4-dimethylaminobenzophenone, 4-dimethylaminoacetophenone, benzil, anthraquinone, 2-t-butylanthraquinone, 2-methylanthraquinone, phenylanthraquinone, xanthone, thioxanthone, 2-chlorothioxanthone, 2,4-diethylthioxanthone, fluorenone, acridone, 2,4,5-triarylimidazole dimers, e.g., a 2-(o-chlorophenyl)-4,5-diphenylimidazole dimer, a 2-(o-chlorophenyl)-4,5-di(m-methoxyphenyl)imidazole dimer, a 2-(o-fluoro-phenyl)4,5-diphenylimidazole dimer, a 2-(o-methoxy-phenyl)4,5-diphenylimidazole dimer, and a 2-(p-methoxyphenyl)4,5-diphenylimidazole dimer; preferably selected from the group consisting of isopropyl thioxanthone, ethyl dimethylaminobenzoate, dimethoxyphenylacetophenone and 2,2'-bis(o-chlorophenyl)-4,5,4', 5'-tetraphenyl-1,2'-biimidazole.

In the instant liquid photoimageable resist, the photoinitiator is present in an amount greater than about 10%, preferably in an amount from greater than 10% to about 17% by weight, more preferably in an amount from greater than 10% to about 11% by weight, more preferably about 11% by weight of the material without the solvent.

The solvent useful in accordance with this invention comprises solvents which exhibit relatively high flash points, about 16° C. to about 93° C. (60–200° F.), perferably about 38° C. to about 49° C. (100–120° F.), relatively low vapor pressures, about 0.05 to about 5 Torr at 20° C., perferrably about 3.5 to about 4.0 Torr at 20° C. and are relatively low in toxicity, those solvents having a TLV greater than about 50. The solvent may be selected from the group consisting of 2-methoxybutanol, propylene glycol butyl ether, ethylene glycol ethyl ether acetate, propylene glycol propyl ether, proyplyene glycol tertiary butyl ether, ethylene glycol ethyl ether, and dipropylene glycol methyl ether. Propylene glycol based solvents are preferred over ethylene glycol based solvents. Preferably, the solvent comprises propylene glycol methyl ether acetate.

The liquid photoimageable resist of the instant invention may optionally comprise a thermal polymerization inhibitor useful in preventing thermal polymerization during application, drying and storage. Examples of useful thermal polymerization inhibitors are p-methoxyphenol, hydroquinone, alkyl and aryl-substituted hydroquinones and quinones, tertbutyl catechol, pyrogallol, copper resinate, β-naphthol, 2,6-di-tert-butyl-p-cresol, 2,2'-methylene-bis(4-ethyl-6-t-butylphenol), p-tolylquinone, chloranil, aryl phosphites, and aryl alkyl phosphites. Other useful thermal polymerization inhibitors will be apparent to those skilled in the art.

The liquid photoimageable resist of the instant invention may optionally comprise a flow modifier. The preferred flow modifier or levelling agent comprises a copolymer of ethyl acrylate and cyclohexyl acrylate commercially known as Modaflow (Modaflow, available from Monsanto, St. Louis, Mo.). Other flow modifiers, such as the Fluorad Series, are useful in providing substantially defect free coatings. (Fluorad, available from 3M, Minneapolis, Minn.). Determination of the necessary amounts of these additives in the instant liquid photoimageable resist formulation would be apparent to those skilled in the art. The flow modifiers can be used at levels of 0.1% to 3.0% preferably 0.5 to 1.0% dry weight.

The liquid photoimageable resist of this invention optionally includes additives well known in the art of photopolymerizable compositions, such as leuco (i.e., printout) dyes, background dyes, adhesion promoters, and antioxidants as disclosed in U.S. Pat. Nos. 4,297,435, and 4,268,610 incorporated herein in their entireties by reference. Other optional additives will be apparent to those skilled in the art. While desirable, the optional additives are not necessary to the instant invention.

Generally, in the process of producing a negative resist image on a surface, the liquid photoimagable resists may be applied via a roller coater, a screen coater, a curtain coater or a spin coater, other application means known in the art. Typically, the surface is a copper surface on a copper clad substrate. Subsequently, the substrate is heated to remove the solvent from the liquid photoimagable resists. In the instant process, preferably substrate is heated above about 93° C. (about 200° F.), preferably about 93° C. to about 107° C. (about 200° F. to about 225° F.) to remove substantially all of the solvent from the resist material to form a dry adherent film. Thickness of the dry adherent film is typically about 0.3 mils or greater, preferably about 0.3 to about (0.7) mils.

Subsequently, the dry adherent film is exposed to actinic radiation through a negative to create a latent image of photopolymerized material, and developed in a known aqueous developing solution to remove the unpolymerized composition from the copper surface. The portions of the surface not covered by the photopolymerized material are then modifiable by known processes, e.g., by plating or etching procedures, while the photoresist protects the covered surface. The photopolymerized material can be ultimately removed from the substrate by washing with known stripping solutions.

Generally, the amount of actinic radiation used to polymerize the composition varies from about 35 to about 150 mJ/cm$^2$, with precise amounts determinable by those skilled in the art based on the specific composition used. U.S. Pat. No. 4,293,635, and U.S. Pat. No. 4,268,610, previously incorporated by reference herein, disclose examples of photoimaging techniques and equipment, including radiation sources, exposure intensity and duration, developing and stripping solutions and techniques, and laminated board compositions.

The copper clad substrate is any known copper/dielectric laminate used in circuit board manufacture, such as a copper clad board of fiberglass reinforced epoxy resin. Other useful dielectrics will be apparent to those skilled in the art.

The aqueous developing solutions used in accordance with this invention have, by weight, about 0.5–10% alkaline agents, preferably about 0.5–1%, and the latent imaged board is washed in the solution for a time sufficient to remove the unpolymerized composition. Useful alkaline agents are alkali metal hydroxides, e.g., lithium, sodium and potassium hydroxide, the base reacting alkali metal salts of weak acids, e.g., sodium carbonate and bicarbonate, and alkali metal phosphates and pyrophosphates. The circuit board can be submerged in the developing solution or the solution is high pressure sprayed on the board.

In general, the stripping solutions useful in removing the photopolymerized material in accordance with the instant invention are heated alkaline aqueous solutions, for example, solutions containing the same alkaline agents as the developing solutions, but having a higher alkaline concentration, i.e., generally, by weight, from about 1%–10%, preferably from about 1%–3%. Generally, the stripping solution is heated to a temperature of about 45° C.–65° C., preferably about 50° C.–55° C. Washing the substrate to remove the photopolymerized material is by methods well known to those skilled in the art, such as spraying the substrate with the heated stripping solution or, preferably, agitating the substrate in a heated bath of the stripping solution. Amongst the advantages of the instant liquid photoimagable resist is the material's ability to develop relatively cleanly with substantially no residue. This results in a process with relatively fast etch rates, particularly in cupric chloride etchants.

The $T_g$ of the binder was determined using Differential Scanning Calorimetry (DSC). The Tg was recorded as the mid-point of the transition at a scan rate of 10° C./minute under a nitrogen atmosphere.

The following examples are provided to better disclose and teach the preparation of the liquid-applied photoresist compositions and the process for producing a negative resist images using the liquid-applied photoresist compositions of the present invention. These examples are for illustrative purposes only, and it must be acknowledged that minor variations and changes can be made without materially affecting the spirit and scope of the invention as recited in the claims that follow.

EXAMPLES 1–4

Liquid resist in accordance with the instant invention were prepared by combining the ingredients in the amounts listed in Table 1 in an eight ounce glass jar, mechanically stirred at 500 rpm at 20–25° C. until a homogeneous liquid resist composition was obtained.

The composition was applied on copper clad laminate or panel using either a roller (available from Black Brothers, Mendota, Ill.) or spin coater (available from Headway Research Inc., Garland, Tex.). The resist was applied to have a minimum dry thickness of 0.3 mils and exhibited excellent coatability with no observable coating defects such as dewetting, fisheyes, dishdowns or the like.

The coated panel was dried in a vented Blue M oven at 93–107° C. (200–225° F.) at a rate to provide a residence time within the oven so that the residual solvent in the coating is reduced to less than 1 wt %. The coated panels were vertically stacked and allowed to remain in contact with one another for 72 hours under ambient atmospheric conditions to provide sufficient time for the coated panels to block with one another. The coated plates were observed during this time to determine if there was any discernable blocking between the plates during storage.

The coated panels are then exposed at 100–150 mJ/cm$^2$ in a conventional exposure unit (Mimir 9224, available from Mimir Instruments, Incorporated, Santa Clara, Calif.) with a minimum lamp intensity of 8 mW/cm$^2$ and having a wavelength of maximum intensity at 300–400 nm. The photospeed of the resists were determined using a Stouffer 41 Step. The panels were developed in 1.0% sodium carbonate monohydrate at 32° C. (90° F.) with a breakpoint of 50%. The developed panels were then etched in cupric chloride then stripped in 3% potassium hydroxide at 54° C. (130° F.). Etched panels were finally inspected for defects.

The results of this testing are found in Table 1.

TABLE 1

| Ingredient | Example 1 | Example 2 | Example 3 | Example 4 |
|---|---|---|---|---|
| Acrylic polymer[1] | 25.45 | 24.46 | 24.42 | 25.34 |
| SR480 | 12.01 | 12.35 | 11.71 | 11.82 |
| BHT | 0.02 | 0.02 | 0.02 | 0.02 |
| ITX | 0.56 | 1.03 | 1.16 | 0.89 |
| EDB | 1.54 | 2.82 | 3.17 | 1.69 |
| DMPAP | 1.54 | 2.82 | 3.17 | 1.69 |
| BCIM | 0.10 | 0.10 | 0.10 | 0.30 |
| Modaflow | 0.62 | 0.33 | 0.33 | 0.32 |
| C.I. Solvent Red 49 | 0.063 | 0.066 | 0.064 | 0.063 |
| C.I. Basic Blue 3 | 0.082 | 0.085 | 0.084 | 0.082 |
| C.I. Basic Green | 0.022 | 0.025 | 0.022 | 0.022 |
| Propylene glycol methyl ether acetate | 57.99 | 55.89 | 55.75 | 57.77 |
| Performance Properties | | | | |
| Coatability | + | + | + | + |
| Antiblocking | + | − | − | + |
| Photospeed, 150 mJ/cm$^2$ | SS2 | SS6 | SS6 | SS8 |

Key to Ingredients:
[1] methacrylic acid, methyl methacrylate and ethyl acrylate at a weight ratio of 22.2/64.6/13.2., weight average molecular weight 45000, acid number 130–150.
BHT    butylated hydroxy toluene
Modaflow    Monsanto, St. Louis, MO
SR480    ethoxylated bisphenol A dimethacrylate, Sartomer Co, Exton, PA.
ITX    isopropyl thioxanthone
EDB    ethyl dimethylaminobenzoate, First Chemical, Pascagoula, MS
DMPAP    dimethoxyphenyl-acetophenone, First Chemical, Pascagoula, MS
BCIM    2,2'-bis(o-chlorophenyl)-4,5,4',5'-tetraphenyl-1,2'-biimidazole, Esprit, Rockland, MA It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A negative resist material comprising:
   a) a binder comprising a polymer selected from the group consisting of acrylic polymers and methacrylic polymers;
   b) a monomer having from two to four ethylenic double bonds;
   c) a photo initiator; and
   d) a solvent comprising a compound selected from the group consisting of 2-methoxybutanol, propylene glycol butyl ether, ethylene glycol ethyl ether acetate, propylene glycol propyl ether, propylene glycol tertiary butyl ether, ethylene glycol ethyl ether, dipropylene glycol methyl ether and propylene glycol methyl ether acetate;
Wherein the photoinitiator is present in an amount of greater than 10% by weight of the material without the solvent and wherein the binder has a Tg of 110° C. or greater.

2. The resist material of claim 1 wherein the photoinitiator is present in an amount from greater than 10% to about 17% by weight.

3. The resist material of claim 1 wherein the photoinitiator is present in an amount from greater than 10% to about 11% by weight.

4. The resist material of claim 1 wherein the photoinitiator is present in an amount of about 11% by weight.

5. The resist material of claim 1, wherein the binder has a T$_g$ of about 110° C. to about 120° C.

6. The resist material of claim 1, wherein the material further comprises, a photosensitizer, a leveling agent, a thermal inhibitor and a dye.

7. The resist material of claim 1, wherein the solvent comprises propylene glycol methyl ether acetate.

8. The resist material of claim 1, wherein the binder comprises an acrylic polymer.

9. The resist material of claim 8, wherein the binder is present in an amount of greater than about 60% by weight of the material without the solvent.

10. A process for producing a negative resist image on a surface comprising the steps of:
   a) Coating a resist material onto a conductor clad laminate surface wherein the resist material comprises:
      i) a binder comprising a polymer selected from the group consisting of acrylic polymers and methacrylic polymers;
      ii) a monomer having from two to four ethylenics double bonds;
      iii) a photoinitiator; and
      iv) a solvent comprising a compound selected from the group consisting of 2-methoxybutanol, propylene glycol butyl ether, ethylene glycol ethyl ether acetate, propylene glycol propyl ether, propylene glycol tertiary butyl ether, ethylene glycol ethyl ether, dipropylene glycol methyl ether and propylene glycol methyl ether acetate;
      wherein the photoinitiator is present in an amount of greater than 10% by weight of the material without the solvent and wherein the binder has a Tg of 110° C. or greater;
   b) heating the resist material to remove substantially all of the solvent from the resist material to form a dry adherent film;
   c) exposing the dry adherent film imagewise to actinic radiation to form image; and d) developing the latest image to a negative resist image.

11. The process for producing a negative resist image of claim 10, wherein the resist material is applied by a roller coater.

12. The process for producing a negative resist image of claim 10, wherein the resist material is applied by a screen coater.

13. The process for producing a negative resist image of claim 10, wherein the resist material is applied by a spin coater.

14. The process for producing a negative image of claim 10, wherein the resist is applied by a curtain coater.

15. The process for producing a negative resist image of claim 10, wherein the resist material is heated above about 93° C. (about 200° F.) to remove substantially all of the solvent from the resist material to form a dry adherent film.

16. The process for producing a negative resist image of claim 10, wherein the resist material is heated about 93° C. to about 1 07° C. (about 200° F. to about 225° F.) to remove substantially all of the solvent from the resist material to form a dry adherent film.

* * * * *